United States Patent [19]

Fayfield

[11] Patent Number: 4,982,107

[45] Date of Patent: Jan. 1, 1991

[54] SOURCING OR SINKING OUTPUT CIRCUIT

[75] Inventor: Robert W. Fayfield, Shorewood, Minn.

[73] Assignee: Banner Engineering Corporation, Minneapolis, Minn.

[21] Appl. No.: 308,877

[22] Filed: Feb. 9, 1989

[51] Int. Cl.$^5$ .......................... H03K 5/22; H03K 3/01
[52] U.S. Cl. ..................... 307/236; 307/270; 307/262; 307/296.1; 307/248; 307/257
[58] Field of Search ............... 307/270, 257, 239, 248, 307/296.1, 236, 262; 328/118

[56] References Cited

U.S. PATENT DOCUMENTS

| | | | |
|---|---|---|---|
| 2,866,909 | 12/1958 | Trousdale | 307/257 |
| 3,278,757 | 10/1966 | Ragen | 307/257 |
| 3,573,501 | 4/1971 | Diehl | 307/257 |
| 3,597,633 | 8/1971 | Hirano et al. | 307/257 |
| 4,423,456 | 12/1983 | Zaidenweber | 307/262 |

FOREIGN PATENT DOCUMENTS 1059685 11/1964 United Kingdom .
1285903 11/1969 United Kingdom .

Primary Examiner—Stanley D. Miller
Assistant Examiner—Richard Roseen
Attorney, Agent, or Firm—Merchant, Gould, Smith, Edell, Welter & Schmidt

[57] ABSTRACT

The present invention provides an output signal comprising a sourcing or sinking current for a sensor or control device. The type of output generated by the sensor or control device depends upon the polarity of the power supply. The DC circuit of the present invention is comprised of two input terminals for supplying voltage to the circuit. The DC circuit is also comprised of output means for delivering either a current sinking signal or a current sourcing signal. The present invention is further comprised of a control circuit having a connection to an externally supplied drive signal, the input terminals, and the output means. A current sourcing signal is produced in response to an occurrence of the drive signal when the first input terminal is positive with respect to the second input terminal. A current sinking signal is produced in response to an occurrence of the drive signal when the second input terminal is positive with respect to the first input terminal.

4 Claims, 3 Drawing Sheets

SOURCING OR SINKING OUTPUT CIRCUIT

FIELD OF THE INVENTION

This invention pertains to the field of electronic sensor and control devices, and in particular, to devices having outputs which provide either a sourcing or sinking DC current.

BACKGROUND OF THE PRIOR ART

Electronic sensors and related control devices are widely used in the field of industrial controls. For example, photoelectric sensors are used for detecting the presence or absence of an object, and for providing a signal or switching accordingly.

Most such sensor and control devices which are intended to operate on low voltage DC provide either a current sourcing output or a current sinking output. The current sourcing output is typically a PNP transistor and the current sinking output is typically a NPN transistor. European engineers have traditionally preferred the current sourcing outputs, while American and Japanese engineers have traditionally preferred current sinking outputs. Due to the global aspects of today's markets, it is desirable to sell sensor and control devices with both types of outputs. However, selling different models, each of a different output type, doubles the inventory requirements for the seller.

Some companies manufacture such devices with two different output wires: one wire for current sourcing output and one wire for current sinking output. This is a good solution, except that it requires an extra lead on output. Typically, only one or the other type of output is used by the customer. Since many customers request a connector with the device, the extra lead results in an extra pin on the connector. Furthermore, some devices have more than one output function. If each output is to have a sourcing and sinking output, the need for extra leads increases.

One solution is to install a switch in the device to allow selection of the output type. This is undesirable due to the resulting size increase in the device. An additional problem is that switches are not as reliable as solid state components.

Another solution is to supply a "push-pull" type output for the device. In this type output, a sourcing transistor output and a sinking transistor output are tied together and driven such that only one of the transistors conducts at a given time. Such a configuration eliminates the need for the extra lead, but it makes it impossible to tie outputs of multiple devices together in parallel to provide the "wired OR" function. If multiple "push-pull" type outputs were tied together in parallel, there would be a short circuit across the supply line if one output was sourcing and the other sinking.

The present invention provides improvements in the design of sensors and control devices of the type described above through the use of a "push-pull" type output circuit that disables one or the other of the output transistors.

SUMMARY OF THE INVENTION

The present invention provides an output signal comprising a sourcing or sinking current for a sensor or control device. The type of output generated by the sensor or control device depends upon the polarity of the power supply.

DESCRIPTION OF THE DRAWINGS

In the drawings, where like numerals refer to like elements throughout the several views.

DETAILED DESCRIPTION OF THE PREFERRED EMBODIMENTS

In the following detailed description of the preferred embodiments, reference is made to the accompanying drawings in which is shown by way of illustration three preferred embodiments in which the invention may be practiced. It is to be understood that other embodiments may be used without departing from the scope of the present invention.

In the present invention, either the sourcing output transistor or the sinking output transistor is disabled by reversing the polarity of the supply voltage. The supply voltage is full wave rectified by the circuit, so the disabling operation has no effect on the operation of the remainder of the circuit.

Figure 1:
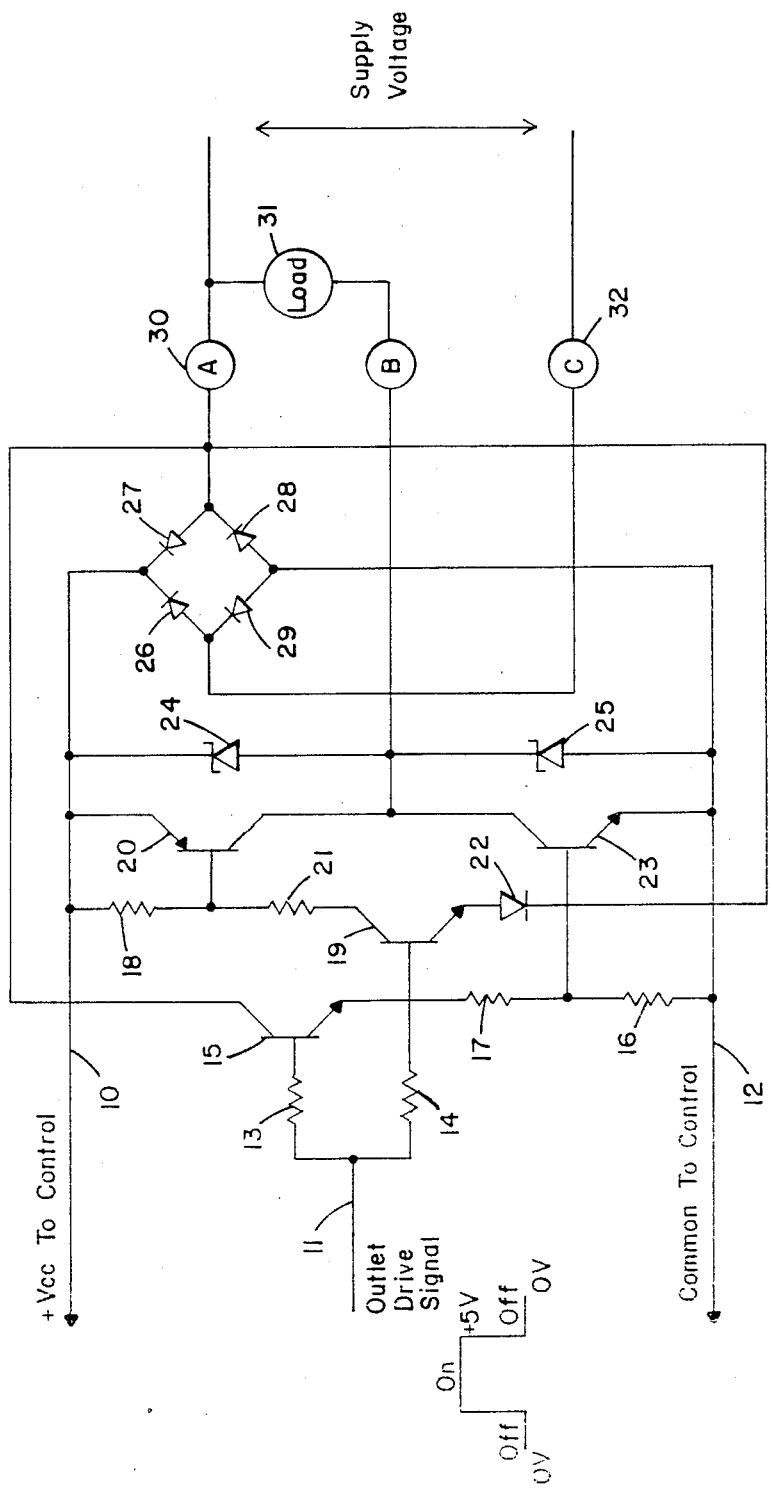
FIG. 1 is a schematic electrical diagram for the first preferred embodiment of a circuit incorporating the present invention.

Referring initially to the first preferred embodiment in FIG. 1, Vcc 10 and Common 12 comprise the wires supplying the output current. The voltage on Vcc 10 and Common 12 is equal to the supply voltage across supply terminals 30 and 32 less the amount lost in the bridge rectifier comprised of diodes 26, 27, 28 and 29.

Output Drive Signal 11 is a logic level signal derived from the sensor or control device incorporating the present invention. When the Output Drive Signal 11 goes high (e.g., +5v DC) it attempts to cause transistors 15 and 19 to conduct. If both transistors 15 and 19 conduct, they would then turn on output transistors 23 and 20 respectively. However, depending on the polarity of the supply voltage across supply terminals 30 and 32, one of the two transistors, 23 or 20, will be prevented from turning on.

If supply terminal 30 is positive with respect to supply terminal 32, transistor 19 is reverse biased and cannot conduct. Therefore, transistor 20 cannot turn on. Diode 22 prevents reverse voltage breakdown of the emitter-base junction for transistor 19. Resistors 18 and 21 are used to hold transistor 20 in an "off" state, in case there is some small leakage of current through transistor 19 in its "off" state. Resistor 14 limits the current into the base of transistor 19.

If supply terminal 32 is positive with respect to supply terminal 30, there is no supply current available for the collector of transistor 15. Without such a supply current, transistor 15 cannot drive transistor 23. Resistors 16 and 17 are used to hold transistor 23 in an "off" state, in case there is some small leakage of current through transistor 15 in its "off" state. Resistor 13 limits the current into the base of transistor 15.

Zener diodes 24 and 25 prevent transient voltage spikes from damaging the output transistors 20 and 23. The clamping level is equal to the sum of the respective Zener voltages.

Rectifier diodes 26, 27, 28 and 29 provide a bridge to rectify the supply voltage. Rectifier diodes 26 through 29 simply serve to make Vcc 10 positive with respect to Common 12, regardless of the polarity of the supply voltage 30 and 32.

Load 31 can be any DC load within the operating specifications of the present invention. Typically, it is a relay or the input to a programmable logic controller (PLC). It is this latter load that makes the present invention valuable, because approximately half of the commercially available PLCs on the market require sourcing inputs and half require sinking inputs. Sensors and other devices using the present invention permit the customer to use either type of PLC.

Figure 2:
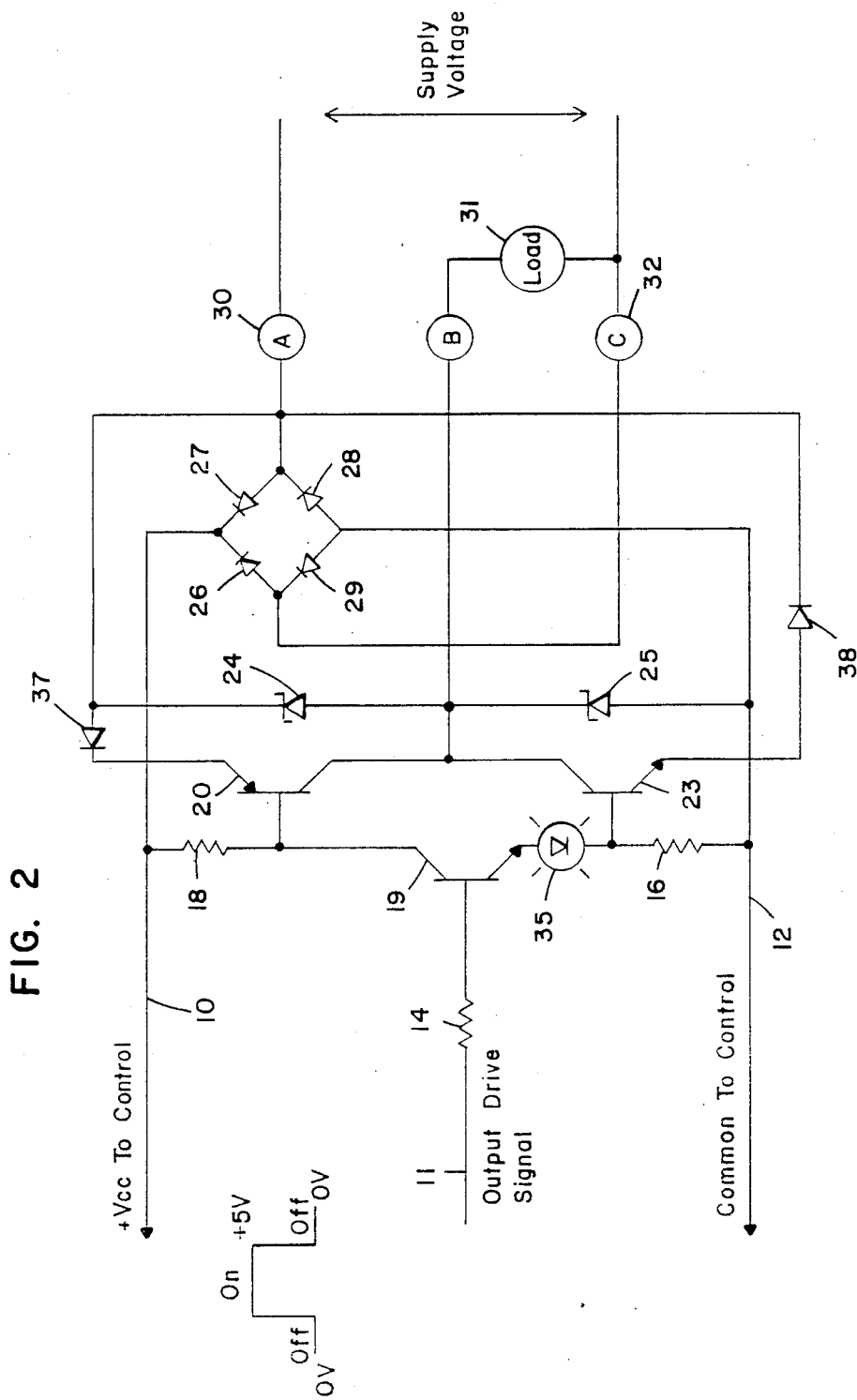
FIG. 2 is a schematic electrical diagram for the second preferred embodiment of a circuit incorporating the present invention.

Referring to FIG. 2, the operation of the second preferred embodiment is nearly the same as the first preferred embodiment shown in FIG. 1, except that the disabling of one or the other output transistors 20 or 23 is caused by blocking their emitters using diodes 37 or 38. If supply terminal 30 is positive with respect to supply terminal 32, diode 38 is reversed biased and cannot conduct. If supply terminal 32 is positive with respect to supply terminal 30, diode 37 is reversed biased and cannot conduct. The Output Drive Signal 11 causes transistor 19 to conduct which causes bias current to flow through the emitter/base junction of transistor 20 or through the base/emitter junction of transistor 23 depending on which diode, 37 or 38, is reversed biased.

Figure 3:
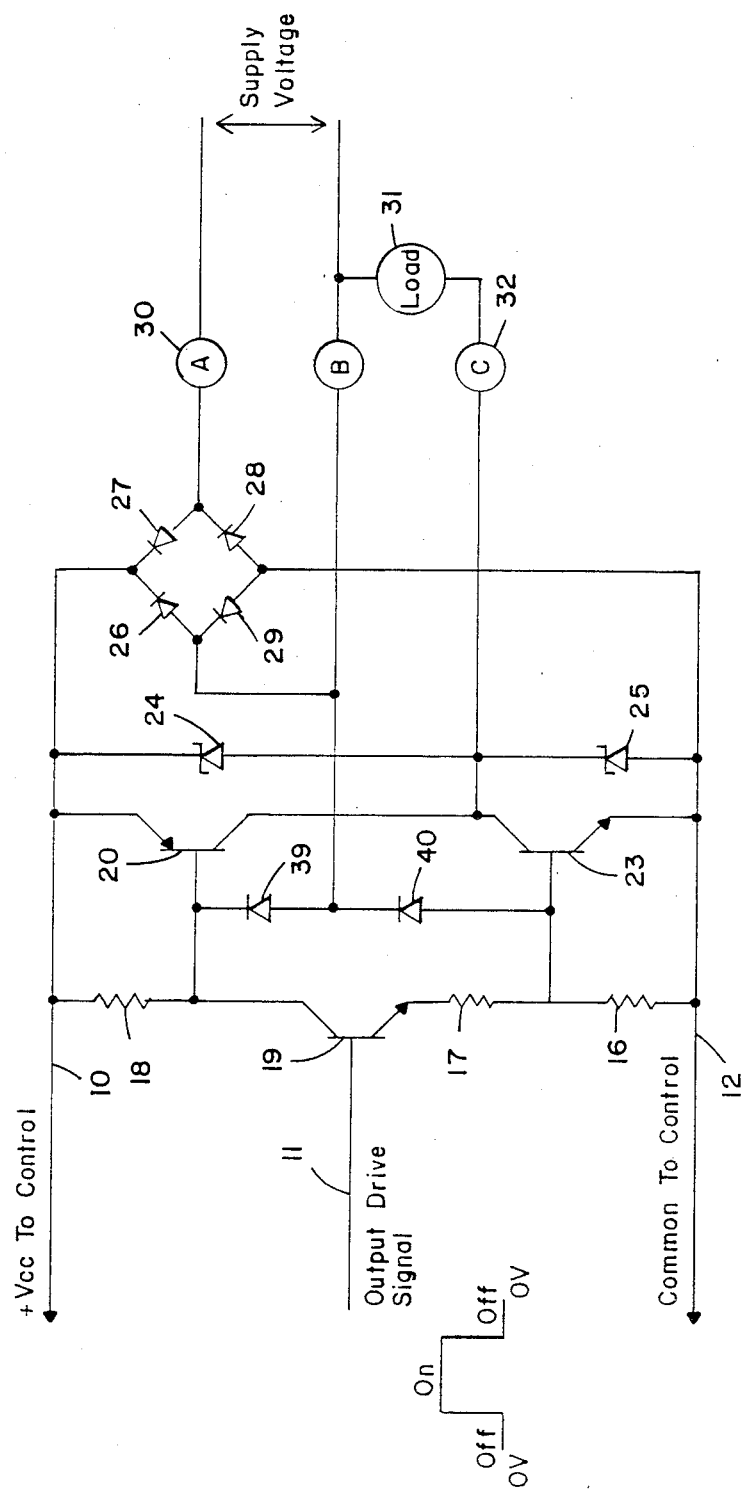
FIG. 3 is a schematic electrical diagram of the third preferred embodiment of a circuit incorporating the present invention.

Referring to FIG. 3, the operation of the third embodiment is nearly the same as the second preferred embodiment illustrated in FIG. 2, except that one of the output transistors, 20 or 23, is disabled by bringing its base to the same potential as its emitter. Note that if supply terminal 30 is positive relative to supply terminal 32, the emitter of transistor 23 will be one diode drop (e.g., 0.6 volts) higher than supply terminal 32. The base of transistor 23 will also be one diode drop higher than supply terminal 32 due to diode 40. Therefore, the base of transistor 23 is not high enough above the emitter of transistor 23 to cause conduction (it must be 0.6 volts higher). A similar operation occurs for transistor 20 and diode 39.

Although three schematics have been illustrated and described for the preferred embodiments of the present invention set forth herein, it will be appreciated by those of ordinary skill in the art that any circuit which is calculated to achieve the same purpose may be substituted for the ones shown. Thus, the present invention disclosed herein may be implemented through the use of different components. This application is intended to cover any adaptations or variations of the present invention. Therefore, it is manifestly intended that this invention be limited only by the claims and equivalents thereof.

What is claimed is:

1. A DC circuit, comprising:
   input means including first and second input terminals for supplying voltage to the circuit;
   output means for delivering either a current sinking signal or a current sourcing signal; and
   control means having a terminal for connection to an externally supplied drive signal and operatively connected to said input means and said output means for producing said current sourcing signal in response to an occurrence of said drive signal when said first input terminal is positive with respect to said second input terminal, and for producing said current sinking signal in response to an occurrence of said drive signal when said second input terminal is positive with respect to said first input terminal.

2. The DC circuit of claim 1, wherein the control means are comprised of:
   a first transistor of type NPN, wherein said first transistor is comprised of a collector connected to said output means, an emitter connected to said first input terminal, and a base connected to said drive signal;
   a second transistor of type PNP, wherein said second transistor is comprised of a collector connected to said first input terminal, an emitter connected to said output means, and a base connected to the collector of said first transistor;
   a third transistor of type NPN, wherein said third transistor is comprised of a collector connected to said first input terminal, an emitter connected to said output means, and a base connected to said drive signal; a fourth transistor of type NPN, wherein said fourth transistor is comprised of a collector connected to said first input terminal, an emitter connected to said output means, and a base connected to the emitter of said third transistor;
   current sinking output control means such that when said first input terminal is positive and said second input terminal is negative, then said first transistor is reversed biased and cannot conduct, thereby preventing said second transistor from turning on, and said third transistor is forward biased and can conduct, thereby allowing said fourth transistor to turn on; and
   current sourcing output control means such that when said second input terminal is positive with respect to said first input terminal, then said collector of said third transistor receives no current and cannot conduct, thereby preventing said fourth transistor from turning on, and said first transistor is supplied current and can conduct, thereby allowing said second transistor to turn on.

3. The DC circuit of claim 1, wherein the control means are comprised of:
   a first transistor of type PNP, wherein said first transistor is comprised of a collector connected to said second input terminal, an emitter connected to said first input terminal, and a base connected to said drive signal;
   a first diode connected between said emitter of said first transistor and said first input terminal;
   a second transistor of type NPN, wherein said second transistor is comprised of a collector connected to said second input terminal, an emitter connected to said first input terminal, and a base connected to said drive signal;
   a second diode connected between said emitter of said second transistor and said first input terminal;
   current sinking output control means such that when said first input terminal is positive with respect to said second input terminal, said first diode is reversed biased and cannot conduct, thereby preventing said first transistor from conducting, and said second diode and said second transistor are forward biased and can conduct, thereby producing a current sinking output signal; and
   current sourcing output control means such that when said second input terminal is positive with respect to said first input terminal, said second diode is reversed biased and cannot conduct, thereby preventing said second transistor from conducting, and said first diode and said first transistor are forward biased and can conduct, thereby producing a current sourcing output signal.

4. The DC circuit of claim 1 wherein said control means further comprises:
- a first transistor of type PNP, wherein said first transistor is comprised of a collector connected to said output means, an emitter connected to said first input terminal, and a base connected to said drive signal;
- a second NPN transistor of type NPN, wherein said second transistor is comprised of a collector connected to said second input terminal, an emitter connected to said output means, and a base connected to said drive signal;
- current sinking output control means such that when said first input terminal is positive with respect to said second input terminal said base of said first transistor is the same potential as said emitter of said first transistor, thereby preventing said first transistor from turning on and allowing said second transistor to produce a current sinking output signal; and
- current sourcing output control means such that when said second input terminal is positive with respect to said first input terminal said base of said second transistor is the same potential as said emitter of said second transistor, thereby preventing said second transistor from turning on and allowing said first transistor to produce a current sourcing output signal.

* * * * *